United States Patent
Takmeel et al.

(10) Patent No.: US 10,643,891 B2
(45) Date of Patent: May 5, 2020

(54) VIA STRUCTURES AND VIA PATTERNING USING OBLIQUE ANGLE DEPOSITION PROCESSES

(71) Applicant: GLOBALFOUNDRIES INC., Grand Cayman (KY)

(72) Inventors: Qanit Takmeel, Latham, NY (US); Somnath Ghosh, Clifton Park, NY (US); Anbu Selvam K M Mahalingam, Mechanicville, NY (US); Craig M. Child, Gansevoort, NY (US); Sunil K. Singh, Mechanicville, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 16/124,786

(22) Filed: Sep. 7, 2018

(65) Prior Publication Data

US 2020/0083099 A1    Mar. 12, 2020

(51) Int. Cl.
| | | |
|---|---|---|
| *H01L 31/18* | (2006.01) |
| *H01L 21/768* | (2006.01) |
| *H01L 21/02* | (2006.01) |
| *H01L 21/311* | (2006.01) |
| *H01L 21/288* | (2006.01) |

(52) U.S. Cl.
CPC .. *H01L 21/76879* (2013.01); *H01L 21/02167* (2013.01); *H01L 21/2885* (2013.01); *H01L 21/31116* (2013.01); *H01L 21/76802* (2013.01); *H01L 21/76819* (2013.01); *H01L 21/76846* (2013.01); *H01L 21/76847* (2013.01)

(58) Field of Classification Search
CPC ......... H01L 21/76879; H01L 21/02167; H01L 21/2885; H01L 21/31116; H01L 21/76802; H01L 21/76819; H01L 21/76846; H01L 21/76847
USPC ........................................................ 438/637
See application file for complete search history.

(56) References Cited

U.S. PATENT DOCUMENTS

| | | | |
|---|---|---|---|
| 6,206,065 B1 | 3/2001 | Robbie et al. | |
| 9,984,919 B1 | 5/2018 | Zhang et al. | |
| 2008/0265933 A1* | 10/2008 | Tanioka | G01R 31/2886 324/756.04 |

OTHER PUBLICATIONS

Barranco et al., "Perspectives on oblique angle deposition of thin films: From fundamentals to devices", Progress in Materials Science 76, 2016, 95 pages.

(Continued)

*Primary Examiner* — Long K Tran
(74) *Attorney, Agent, or Firm* — Anthony Canale; Andrew M. Calderon; Roberts Calderon Safran & Cole, P.C.

(57) ABSTRACT

The present disclosure relates to semiconductor structures and, more particularly, to via structures and via patterning using oblique angle deposition processes. The method includes: depositing a material on a lower wiring layer; forming one or more openings in the material; filling the one or more openings with a conductive material; growing via structures on the conductive material; forming interlevel dielectric material on the via structures; and forming an upper wiring layer on the interlevel dielectric material and in contact with the via structures.

20 Claims, 2 Drawing Sheets

(56) References Cited

OTHER PUBLICATIONS

Zhao et al., "Designing Nanostructures by Glancing Angle Deposition", Proceedings of SPIE vol. 5219, 2003, 15 pages.
Jeong et al., "3D nanofabrication on complex seed shapes using glancing angle deposition", IEEE, 2014, 4 pages.

* cited by examiner

VIA STRUCTURES AND VIA PATTERNING USING OBLIQUE ANGLE DEPOSITION PROCESSES

FIELD OF THE INVENTION

The present disclosure relates to semiconductor structures and, more particularly, to via structures and via patterning using oblique angle deposition processes.

BACKGROUND

Via structures (e.g., interconnect structures) are a critical component of semiconductor devices. For example, via structures are used to interconnect wiring structures on different layers of the device. The via structures are formed by complex fabrication processes, e.g., lithography, etching, deposition and planarization processes, which are costly and time consuming.

More specifically, after a deposition of interlevel dielectric material over a lower wiring layer, lithography and etching processes require deposition of several different hardmask layers and resist formation, followed by exposure of energy through complex masking processes. After each of the etching processes, the material needs to be removed. Once a trench or via is formed in the interlevel dielectric layer, a metal deposition process is required to form the via structures. The deposition process, though, leaves a residue of metal material on the interlevel dielectric material, requiring additional processing steps, e.g., including a chemical mechanical polishing (CMP) process. In addition, as technology nodes continue to scale downwards, the fabrication processes become ever more complex and costly.

SUMMARY

In an aspect of the disclosure, a method comprises: depositing a material on a lower wiring layer; forming one or more openings in the material; filling the one or more openings with a conductive material; growing via structures on the conductive material; forming interlevel dielectric material on the via structures; and forming an upper wiring layer on the interlevel dielectric material and in contact with the via structures.

In an aspect of the disclosure, a method comprises: forming an insulator material on a lower wiring layer; forming one or more openings in the insulator material to expose portions of the lower wiring layer; forming a barrier layer in the one or more openings; forming a conductive material on the barrier layer through an electroplating process; performing an oblique angle deposition process to form via structures on the conductive material; and forming an interlevel dielectric material over the via structures.

In an aspect of the disclosure, a method comprises: patterning a nitrogen or oxygen based material formed on a wiring layer; depositing liner and barrier material in the pattern of the nitrogen based material; filling in the pattern over the liner and barrier material with conductive material using an electroplating process; growing vertical via structures on the conductive material; depositing a low-k dielectric material on the via structures; etching back the low-k dielectric material; planarizing the low-k dielectric material and the via structures; and forming an upper wiring layer on the low-k dielectric material and in contact with the via structures.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to via structures and via patterning using oblique angle deposition processes. More specifically, the present disclosure provides an oblique angle deposition process for via patterning (via formation). In more specific embodiments, a shadowing effect of an oblique angle deposition technique, including, but not limited to, glancing angle deposition, is used to achieve via patterns. Advantageously, the oblique angle deposition process will reduce the number of steps involved in via patterning.

In embodiments, the method of forming the via structures includes patterning a first material, e.g., nitrogen or oxygen doped carbide (NDC), to expose an underlying wiring layer, followed by depositing a liner, barrier material and seed layer within the patterned opening. In embodiments, the first material can also be an etch stop layer or any such layer used to separate two metal layers. A copper (Cu) seed can be grown over the liner and barrier material. In embodiments, Cu seeds can be grown using a chemical vapor deposition (CVD) process. The method further comprises growing via structures, e.g., interconnect structures, using an oblique angle deposition process to form the via structures. Interlevel dielectric material is deposited over the via structures using CVD, which is planarized using a chemical mechanical polishing (CMP) process.

The via structures of the present disclosure can be manufactured in a number of ways using a number of different tools. In general, though, the methodologies and tools are used to form structures with dimensions in the micrometer and nanometer scale. The methodologies, i.e., technologies, employed to manufacture the via structures of the present disclosure have been adopted from integrated circuit (IC) technology. For example, the structures are built on wafers and are realized in films of material patterned by photolithographic processes on the top of a wafer. In particular, the fabrication of the via structures uses three basic building blocks: (i) deposition of thin films of material on a substrate, (ii) applying a patterned mask on top of the films by photolithographic imaging, and (iii) etching the films selectively to the mask.

Figure 1:
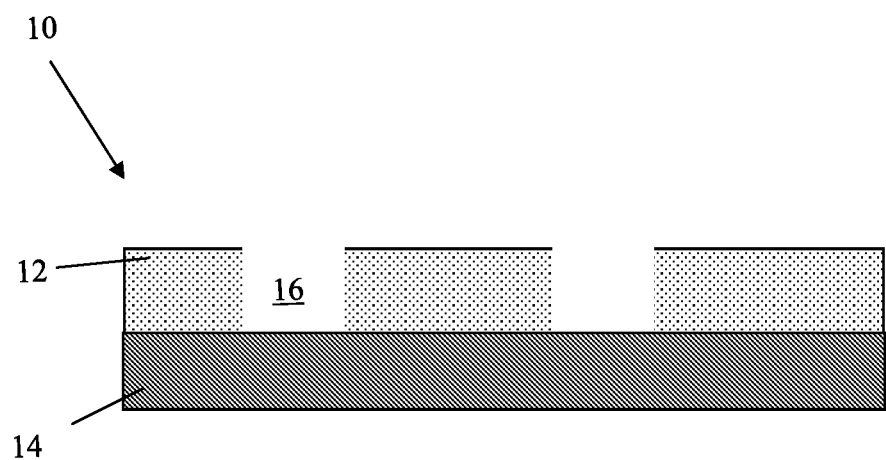
FIG. 1 shows openings in a material above a lower wiring layer and respective fabrication processes in accordance with aspects of the present disclosure.

FIG. 1 shows openings in a material above a lower wiring layer and respective fabrication processes in accordance with aspects of the present disclosure. More specifically, the structure 10 of FIG. 1 includes a layer of material 12 formed on a lower metal wiring layer 14. In embodiments, the layer of material 12 can be a nitrogen doped carbide (NDC) material; although other insulator layers are also contemplated herein. For example, the material 12 can be SiCN. The material 12 can be deposited by a CVD process to a thickness of about 10 nm to about 25 nm; although other dimensions are also contemplated herein. The lower metal wiring layer 14 can be copper, as an example.

Still referring to FIG. 1, one or more openings 16 are formed in the material 12 to expose portions of the lower metal wiring layer 14. The processes of forming the openings 16 include conventional lithography and etching processes. For example, in forming the openings 16, SiON (or SiN:H where H can be as high as 50% material), hardmask material and a resist are deposited over the material 12. Using a mask, the resist is exposed to energy (light) to form a pattern (opening). An etching process with a selective chemistry, e.g., reactive ion etching (RIE), will be used to form one or more openings in the hardmask material, e.g., BARC. The resist is then removed by a conventional oxygen ashing process or other known stripants.

The SiON is etched through the openings of the hardmask material to expose the underling material 12, followed by removal of the SiON material. The openings 16 are then formed in the material 12 by etching through the openings of the SiON material. The SiON material is removed by conventional processes. In embodiments, the openings 16 have a width of about 10 nm to about 300 microns; although other dimensions are also contemplated herein. It should also be understood that the present disclosure is not confined to circular/oval structures, but rather, various shapes can also be formed. In addition, the vias need not be cylindrical but rather they can be helical in nature. The helical shape would allow for the manipulation of resistance of the vias.

Figure 2:
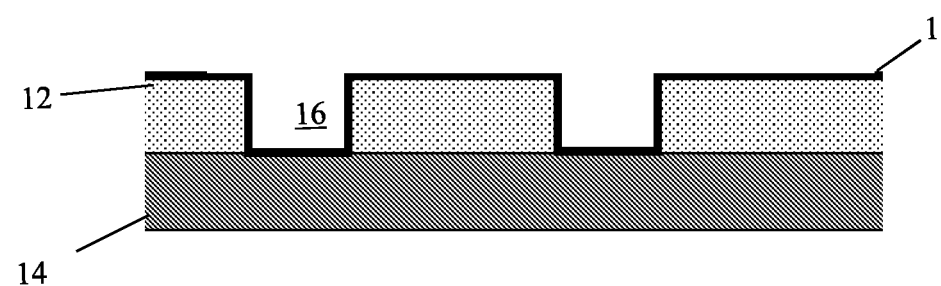
FIG. 2 shows a liner and barrier material within the openings and in contact with the lower wiring layer, amongst other features, and respective fabrication processes in accordance with aspects of the present disclosure.

FIG. 2 shows liner and barrier material 18 within the openings 16 and in contact with the lower metal wiring layer 14, amongst other features. In embodiments, the liner can be, e.g., TaN, and the barrier layer can be, e.g., metal material such as by way of non-limiting example, Cobalt. A copper seed layer (also shown by reference numeral 18) can be deposited within the openings, over the liner and barrier layer. The seed layer can be deposited using either thin sputtering techniques or CVD processes. In embodiments, the liner and barrier material 18 can be deposited to a thickness of about 3 nm or less to reduce resistance, while being thick enough to prevent metal, e.g., copper, diffusion.

Figure 3:
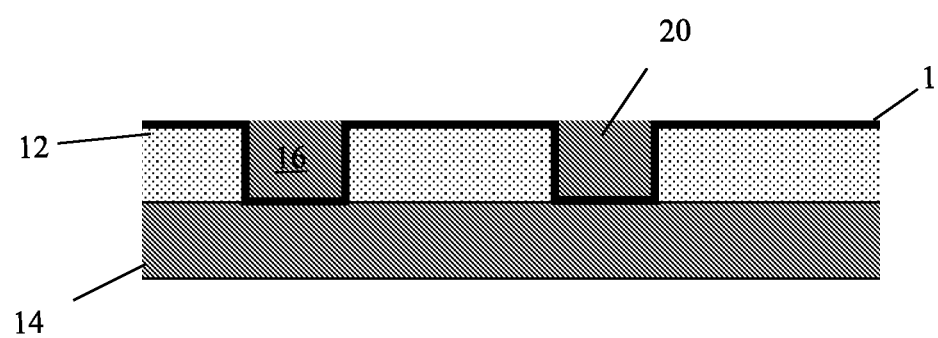
FIG. 3 shows metal material in the openings and respective fabrication processes in accordance with aspects of the present disclosure.

As shown in FIG. 3, a conductive material 20 is formed within the openings 16. In embodiments, the conductive material is copper (Cu), deposited using an electroplating process. Any residual metal material 20 on the surface of the material 12 can be removed by a CMP process.

Figure 4:
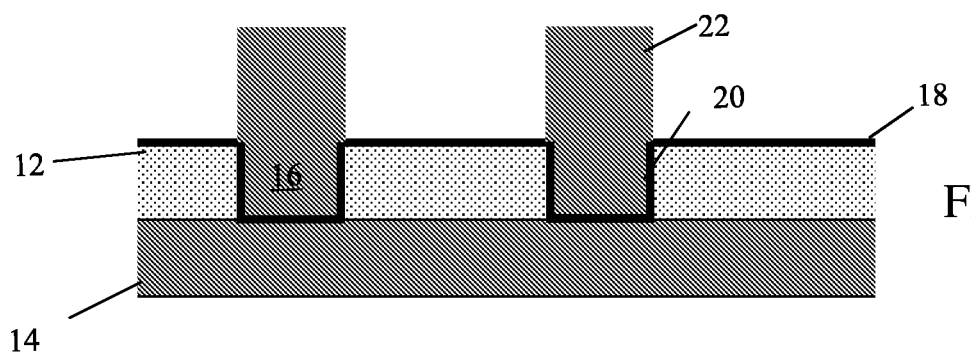
FIG. 4 shows via structures and respective fabrication processes in accordance with aspects of the present disclosure.

In FIG. 4, via structures 22, e.g., interconnect structures, are grown on the conductive material 20 using a glancing angle deposition process. By using the glancing angle deposition process, via structures can be fabricated prior to the deposition of interlevel dielectric material, resulting in less fabrication processes and manufacturing costs. The via structures 22 can be formed of copper material; although other metal or metal alloy materials are also contemplated by the present disclosure. It should also be understood by those of ordinary skill in the art that the via structures 22 will be used as interconnects between different wiring layers, e.g., lower wiring layer 12 and an upper wiring layer.

It should be further understood by those of skill in the art that the glancing angle deposition process comprises physical vapor deposition under conditions of obliquely incident flux and limited adatom diffusion which results in a film with a columnar microstructure. These columns are oriented toward the vapor source. As deposition continues, the columnar structures are influenced by atomic-scale ballistic shadowing and surface diffusion. These columnar microstructures can be fabricated into differently shaped nanostructures, i.e., various morphologies, by rotating the substrate in both polar and azimuthal directions. For example, in the present disclosure the via structures 22 are vertically oriented with a width of about 15 nm; although other dimensions and shapes are contemplated herein. In further embodiments, the aspect ratio of the via structures 22 can be about 70:1, as an example.

Figure 5:
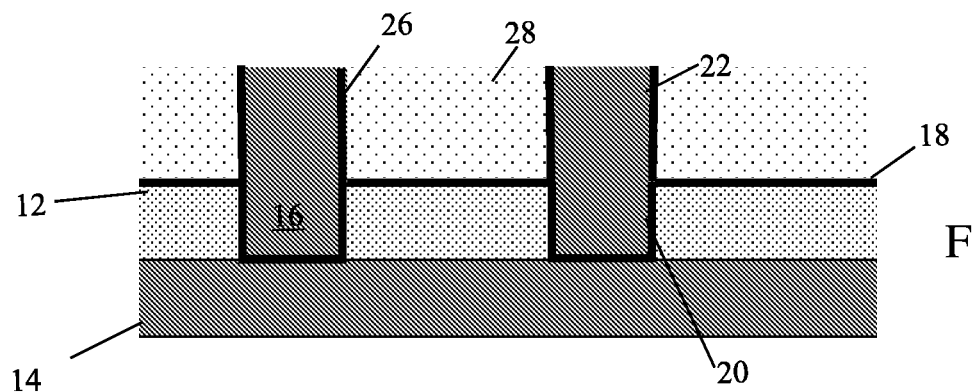
FIG. 5 shows interlevel dielectric material surrounding the via structures, amongst other features, and respective fabrication processes in accordance with aspects of the present disclosure.

FIG. 5 shows interlevel dielectric material 28 over the via structures 22, e.g., interconnect structures. As briefly described, by depositing the interlevel dielectric material 28 over the already formed via structures 22, a significant reduction in fabrication steps and costs is achieved. For example, by implementing the processes described herein, there is no longer a need for lithography and etching processes to form trenches in the interlevel dielectric material 28, followed by a deposition of metal material and a CMP process for forming the via structures.

Still referring to FIG. 5, prior to the deposition of interlevel dielectric material 28, a barrier material 26 is deposited on the via structures 22 (e.g., interconnects). In embodiments, the barrier material 26 can be Ru or Co; although other barrier materials are also contemplated herein. The barrier materials can be deposited by conventional deposition methods including, e.g., area selective deposition (ASD) processes. Alternatively, the barrier metals can be a self-forming barrier, e.g., Mn. A self-forming barrier layer can be deposited after an annealing process, as should be known to those of skill in the art. The barrier material 26 can be about 3 to 4 nm in thickness in order to prevent interdiffusion of metal material of the interconnect structures into the insulator layer (interlevel dielectric material 28).

Following the deposition of the barrier material 26, the interlevel dielectric material 28 is deposited over and surrounding the via structures 22 (e.g., interconnect structures). In embodiments, the interlevel dielectric material 28 can be any low-k dielectric material, e.g., oxide, deposited by a conventional deposition method. For example, oxide can be deposited by a conventional CVD process. The interlevel dielectric material 28 is then etched back, followed by a non-ionic surfactant aided by a CMP process (which also removes barrier metal 26 from a top surface of the via structures 22). In this way, the interlevel dielectric material 28 and the via structures 22 (e.g., interconnect structures) will form a planar surface.

Figure 6:
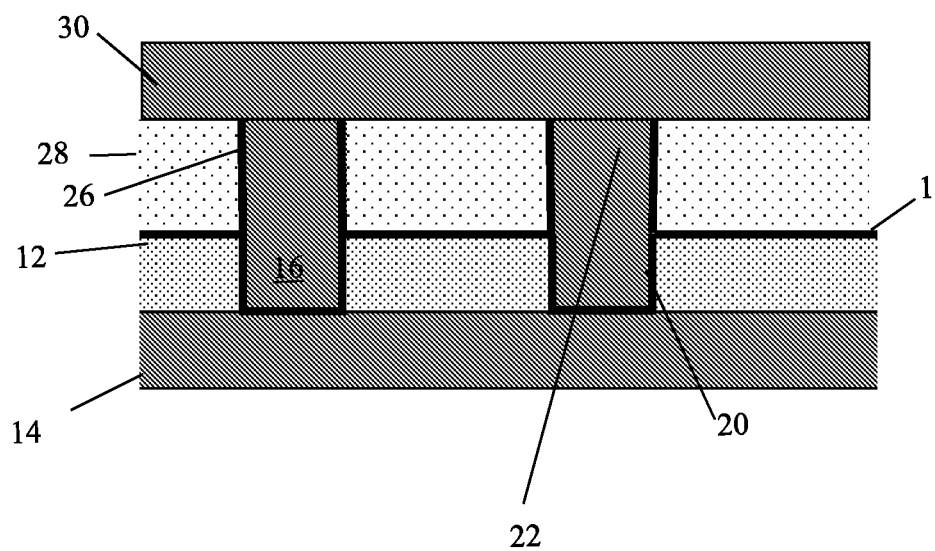
FIG. 6 shows an upper wiring layer in contact with the via structures and respective fabrication processes in accordance with aspects of the present disclosure.

FIG. 6 shows an upper metal layer 30 in contact with the via structures 22. In embodiments, the upper metal layer 30 is a same material as the lower metal layer 14, e.g., copper. The upper metal layer 30 can be deposited by any conventional deposition method including, e.g., plasma vapor deposition (PVD) processes.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A method comprising:
   depositing a material on a lower wiring layer;
   forming one or more openings in the material;
   filling the one or more openings with a conductive material;
   growing via structures on the conductive material;
   forming interlevel dielectric material on the via structures; and
   forming an upper wiring layer on the interlevel dielectric material and in contact with the via structures,
   wherein the growing comprises an oblique angle deposition process.

2. The method of claim 1, wherein the via structures are metal interconnect structures composed of copper material.

3. The method of claim 1, wherein the via structures are vertical via structures of copper material.

4. The method of claim 1, wherein the material is a nitrogen carbide material.

5. The method of claim 4, further comprising lining the one or more openings with a liner and barrier material, prior to the filling of the one or more openings with the conductive material.

6. The method of claim 5, wherein the filling the one or more openings with a conductive material is an electroplating process using copper material.

7. The method of claim 6, further comprising forming a barrier material on the via structures, prior to the forming of the interlevel dielectric material.

8. The method of claim 7, wherein the barrier material is a self-forming barrier material.

9. A method comprising:
   forming an insulator material on a lower wiring layer;
   forming one or more openings in the insulator material to expose portions of the lower wiring layer;
   forming a barrier layer in the one or more openings;
   forming a conductive material on the barrier layer through an electroplating process;
   performing an oblique angle deposition process to form via structures on the conductive material; and
   forming an interlevel dielectric material over the via structures.

10. The method of claim 9, wherein the via structures are composed of copper material.

11. The method of claim 9, wherein the insulator material is a nitrogen carbide material.

12. The method of claim 9, further comprising lining the one or more openings with a liner, prior to the electroplating process.

13. The method of claim 9, further comprising forming a barrier material on the via structures, prior to the forming of the interlevel dielectric material.

14. The method of claim 13, wherein the barrier material is a self-forming barrier material.

15. The method of claim 13, wherein the barrier material is Ru or Co.

16. The method of claim 9, further comprising etching back and planarizing the interlevel dielectric material to expose the via structures and forming an upper wiring layer on the exposed via structures.

17. The method of claim 16, wherein the insulator layer and interlevel dielectric material are different materials.

18. A method comprising:
    patterning a nitrogen based material formed on a wiring layer;
    depositing liner and barrier material in the pattern of the nitrogen based material;
    filling in the pattern over the liner and barrier material with conductive material using an electroplating process;
    growing vertical via structures on the conductive material, which comprises a glancing angle deposition process under conditions of at least obliquely incident flux;
    depositing a low-k dielectric material on the via structures;
    etching back the low-k dielectric material;
    planarizing the low-k dielectric material and the via structures; and
    forming an upper wiring layer on the low-k dielectric material and in contact with the via structures.

19. The method of claim 18, wherein the growing vertical via structures on the conductive material is an oblique angle deposition process.

20. The method of claim 18, wherein the growing vertical via structures on the conductive material comprises the glancing angle deposition process under conditions of obliquely incident flux and adatom diffusion.

* * * * *